United States Patent
Kang et al.

(10) Patent No.: US 10,117,359 B2
(45) Date of Patent: Oct. 30, 2018

(54) SERVER CABINET

(71) Applicant: BEIJING BAIDU NETCOM SCIENCE AND TECHNOLOGY CO., LTD., Beijing (CN)

(72) Inventors: Sheng Kang, Beijing (CN); Guofeng Chen, Beijing (CN); Jiajun Zhang, Beijing (CN); Yongzhong Zhu, Beijing (CN); Jie Wang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/973,432

(22) Filed: Dec. 17, 2015

(65) Prior Publication Data
US 2016/0302329 A1    Oct. 13, 2016

(30) Foreign Application Priority Data
Apr. 9, 2015   (CN) .......................... 2015 1 0166005

(51) Int. Cl.
H05K 7/20 (2006.01)
H05K 7/14 (2006.01)
H05K 7/18 (2006.01)

(52) U.S. Cl.
CPC ....... H05K 7/20736 (2013.01); H05K 7/1488 (2013.01); H05K 7/1492 (2013.01);
(Continued)

(58) Field of Classification Search
CPC ............. H05K 7/20736; H05K 7/1459; H05K 7/1487–7/1489; H05K 7/1492; H05K 7/1494; G06F 1/181
(Continued)

(56) References Cited

U.S. PATENT DOCUMENTS 6,452,809 B1 * 9/2002 Jackson .................... G06F 1/16
                                                          361/724
6,985,357 B2 * 1/2006 Cauthron ............. H05K 7/1488
                                                          312/223.1
(Continued)

FOREIGN PATENT DOCUMENTS

CN         201796329 U     4/2011
CN         102609058 A     7/2012
(Continued)

OTHER PUBLICATIONS

Baidu Scorpio Open Rack Project, Feb. 2013, https://www.youtube.com/watch?v=YaXGSvuElzc.*
(Continued)

Primary Examiner — Adrian S Wilson
(74) Attorney, Agent, or Firm — Hodgson Russ LLP

(57) ABSTRACT

A server cabinet, including: a cabinet body having a plurality of regions including a first region to store a server, a power supply region to store a power supply, a second region to store the server and a switch; and a cabinet backboard positioned at a back side of the cabinet body, and including a plurality of management backboards and a plurality of fans, in which each of the plurality of management backboards is respectively connected with the server and a central management module of the server cabinet, the server is connected with the corresponding management backboard via a connector and controlled by the central management module via the cabinet backboard. The server cabinet according to embodiments of the present disclosure can achieve a replacement of the management backboard and the server without powering off, thus greatly improving an operation and maintenance of the server cabinet.

10 Claims, 7 Drawing Sheets

(52) U.S. Cl.
CPC ............ H05K 7/18 (2013.01); H05K 7/20136 (2013.01); H05K 7/20554 (2013.01)

(58) Field of Classification Search
USPC .................................................. 361/724–727
See application file for complete search history.

(56) References Cited

U.S. PATENT DOCUMENTS

| | | | | |
|---|---|---|---|---|
| 7,045,717 | B2 * | 5/2006 | Kolvick | H01R 13/629 |
| | | | | 174/135 |
| 7,209,351 | B2 * | 4/2007 | Wei | H05K 7/20745 |
| | | | | 361/695 |
| 7,259,961 | B2 * | 8/2007 | Lucero | H05K 7/20563 |
| | | | | 165/121 |
| 7,327,563 | B2 * | 2/2008 | Cauthron | H05K 7/1488 |
| | | | | 361/679.55 |
| D608,776 | S * | 1/2010 | Kang | D14/301 |
| 7,894,195 | B2 * | 2/2011 | Lin | G06F 1/184 |
| | | | | 361/727 |
| 8,670,241 | B2 * | 3/2014 | Sherrod | H05K 7/1488 |
| | | | | 361/725 |
| 2003/0030975 | A1 * | 2/2003 | Bestwick | G06F 1/183 |
| | | | | 361/679.51 |
| 2003/0223193 | A1 * | 12/2003 | Smith | H05K 7/1488 |
| | | | | 361/679.48 |
| 2003/0223199 | A1 * | 12/2003 | Smith | G06F 1/181 |
| | | | | 361/727 |
| 2005/0157461 | A1 * | 7/2005 | Cauthron | H05K 7/1488 |
| | | | | 361/724 |
| 2005/0207134 | A1 * | 9/2005 | Belady | H05K 1/14 |
| | | | | 361/796 |
| 2006/0056142 | A1 * | 3/2006 | Takahashi | G06F 1/30 |
| | | | | 361/679.33 |
| 2007/0047195 | A1 * | 3/2007 | Merkin | G06F 1/206 |
| | | | | 361/679.31 |
| 2007/0115627 | A1 * | 5/2007 | Carlisi | G06F 1/183 |
| | | | | 361/679.01 |
| 2007/0121283 | A1 * | 5/2007 | Lai | G06F 1/183 |
| | | | | 361/679.02 |
| 2008/0043405 | A1 * | 2/2008 | Lee | G06F 1/185 |
| | | | | 361/600 |
| 2008/0180896 | A1 * | 7/2008 | McClure | G06F 1/20 |
| | | | | 361/727 |
| 2008/0259555 | A1 * | 10/2008 | Bechtolsheim | G06F 13/409 |
| | | | | 361/679.4 |
| 2008/0266813 | A1 * | 10/2008 | Carlisi | G06F 1/183 |
| | | | | 361/727 |
| 2009/0097200 | A1 * | 4/2009 | Sharma | G06F 1/18 |
| | | | | 361/688 |
| 2009/0257187 | A1 * | 10/2009 | Mills | H05K 7/20727 |
| | | | | 361/679.33 |
| 2010/0172083 | A1 * | 7/2010 | Randall | G11B 33/126 |
| | | | | 361/679.31 |
| 2010/0217909 | A1 * | 8/2010 | Pavol | G06F 13/409 |
| | | | | 710/301 |
| 2010/0271766 | A1 * | 10/2010 | Lin | G06F 1/184 |
| | | | | 361/679.02 |
| 2011/0176270 | A1 * | 7/2011 | Chou | G06F 1/187 |
| | | | | 361/679.33 |
| 2011/0176271 | A1 * | 7/2011 | Zhang | G06F 1/20 |
| | | | | 361/679.33 |
| 2011/0235262 | A1 * | 9/2011 | Cheng | G06F 1/20 |
| | | | | 361/679.33 |
| 2012/0170208 | A1 * | 7/2012 | Chen | G06F 1/181 |
| | | | | 361/679.48 |
| 2014/0085807 | A1 * | 3/2014 | Ning | G06F 1/20 |
| | | | | 361/679.47 |

FOREIGN PATENT DOCUMENTS

| | | |
|---|---|---|
| CN | 202679818 U | 1/2013 |
| CN | 104334000 A | 2/2015 |
| JP | 2005136248 | 5/2005 |
| JP | 2006079751 | 3/2006 |
| JP | 2013004082 | 1/2013 |
| WO | 2010010626 | 1/2010 |

OTHER PUBLICATIONS

Scorpio Whole Cabinet Server Specifications, Version 2.0, OPENDATACENTER.CN, Aug. 29, 2014.
Dpen Compute Platform—Scorpio Rack Installation and Customization Manual, Schneider Electric, Dec. 2014.
CN201510166005.6 First Office Action (citing CN201796329U and CN102609058A), The State Intellectual Property Office of People's Republic of China, dated Mar. 1, 2017.
Wu, Dolly, Implementing Rack Scale Architecture Using Open Hardware Designs, Inspur Systems Inc., Apr. 14, 2016.
Extended European Search Report, European Patent Office, dated May 9, 2016.
JP2015-250738 Notification of Reasons for Refusal, Shinozuka, Takashi, dated Nov. 8, 2016.
Zhang, Jiajun, Project Scorpio Rack Server V2.0, Aug. 29, 2014.

* cited by examiner

SERVER CABINET

CROSS-REFERENCE TO RELATED APPLICATIONS

This application is based on and claims a priority to Chinese Patent Application No. 201510166005.6, filed on Jun. 9, 2015, the entire content of which is incorporated herein by reference.

FIELD

The present disclosure relates to the field of server, and more particularly to a server cabinet.

BACKGROUND

At present, a type of server cabinet is designed in accordance with an existing standard of 19 inch server, as a board and cables within the server cabinet are such complicated that it is not conducive to the operation and maintenance and heat dissipation of a server. The most important is that a management backboard of the existing server cabinet is typically placed in a space between the server and a fan, therefore it needs to power off the server to replace the management backboard when the management backboard breaks down, which has big impact on the online business. In other words, the existing server cabinet cannot achieve a hot plug and online operation and maintenance of the management backboard and the server, thus leading to a high fault point of the whole server cabinet, and the online business cannot be better guaranteed.

SUMMARY

Embodiments of the present disclosure seek to solve at least one of the problems existing in the related art to at least some extent.

For this, a first objective of the present disclosure is to provide a server cabinet which can achieve a replacement of a management backboard and a server without powering off when breaking down, thus greatly improving the ability to operate and maintain of the server cabinet.

To achieve the above objective, an embodiment of a first aspect of the present disclosure provides a server cabinet, including: a cabinet body having a plurality of regions comprising a first region to store a server, a power supply region to store a power supply, a second region to store the server and a switch; and a cabinet backboard positioned at a back side of the cabinet body, and including a plurality of management backboards and a plurality of fans, in which each of the plurality of management backboards respectively is connected with the server and a central management module of the server cabinet, the server is connected with the corresponding management backboard via a connector and controlled by the central management module via the cabinet backboard.

The server cabinet according to embodiments of the present disclosure has following advantages: 1. a server storage density and an overall storage density of the server cabinet are greatly improved without affecting a layout of a computer room and a transportation mode of the server cabinet; 2. by extra-positioning the management backboard, a replacement of the management backboard and the server can be achieved without powering off the server cabinet when breaking down, thus greatly improving the ability to operate and maintain of the server cabinet; 3. the fan can be adjusted in up-down direction by 1U as the unit, thus the servers with different number and positions can be matched to the fans with different number and positions, thereby optimizing the heat dissipation of the server cabinet, lowering the overall power consumption of the fan, and improving the flexibility and scalability of the overall layout of the server cabinet.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
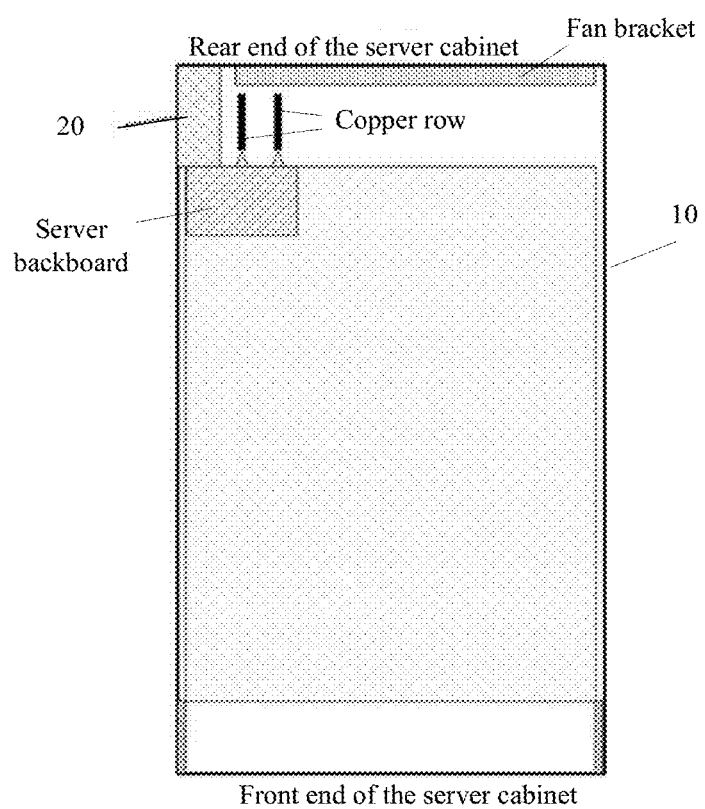
FIG. 1 is a schematic diagram illustrating a server cabinet according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present invention, "a plurality of" means two or more, unless specified otherwise.

In the following, the server cabinet according to embodiments of the present disclosure will be described in detail referring to FIGS. 1-8.

As shown in FIG. 1, the server cabinet includes a cabinet body 10 and a cabinet backboard 20, in which the cabinet body 10 includes a plurality of regions, and the cabinet backboard 20 includes a plurality of management backboards 21 and a plurality of fans 22.

Specifically, the cabinet body 10 has a first region 11, a second region 12 and a power supply 13. The first region 11 is used to store a server, the power supply region 13 is used to store a power supply, and the second region 12 is used to store the server and a switch.

In an embodiment of the present disclosure, the power supply region 13 is positioned above the first region 11, and the second region 12 is positioned above the power supply region 13.

Figure 2:
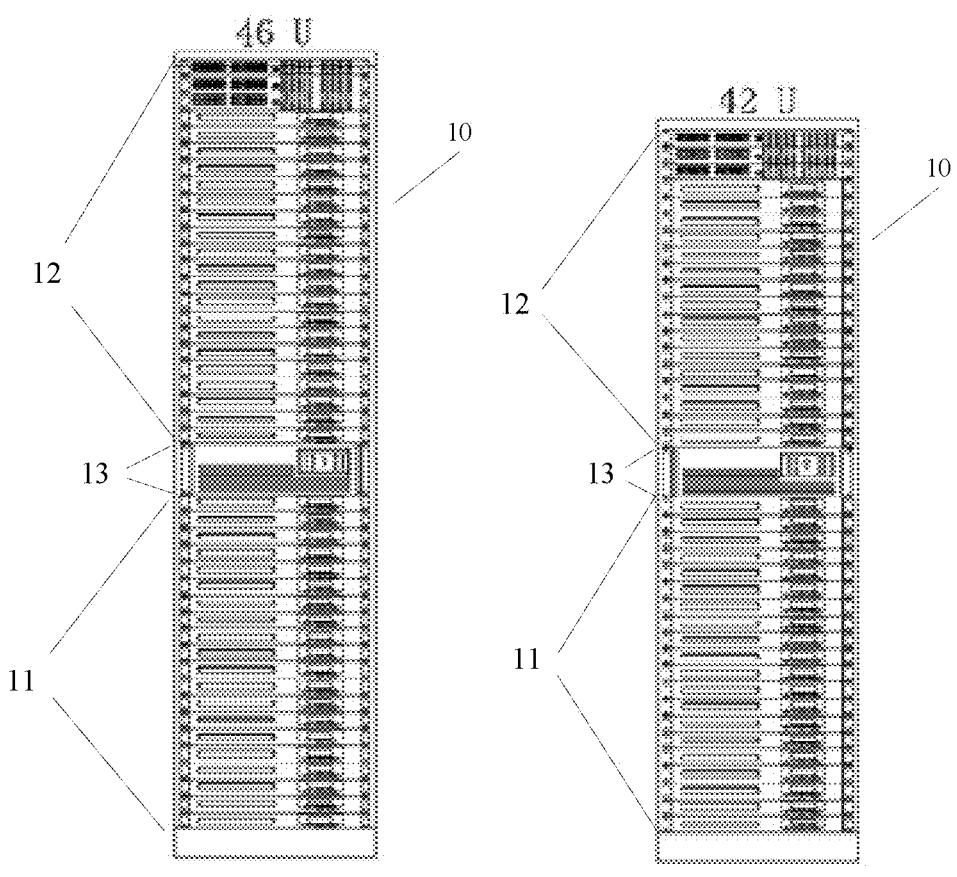
FIGS. 2 (a)-(d) are schematic diagrams illustrating a 46U server cabinet and a 42U server cabinet according to an embodiment of the present disclosure.
Figure 2:
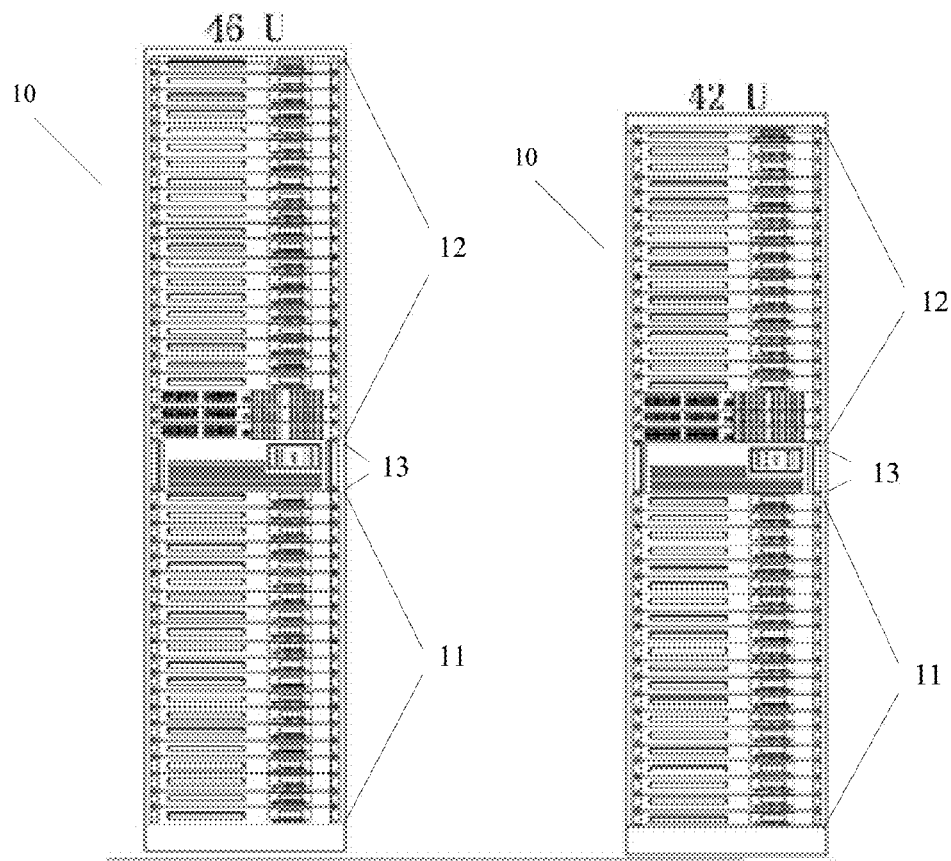

Specifically, as shown in FIGS. 2 (*a*)-2 (*d*), the server cabinet in embodiments of the present disclosure will be illustrated by taking a 46U server cabinet with a height of 2300 mm and a 42U server cabinet with a height of 2100 mm as examples.

As shown in FIG. 2 (*a*) and FIG. 2 (*c*), for the 46U server cabinet 10, a plurality of servers may be placed within the first region 11 of 20U at a lower part, a power supply module group may be placed within the power supply region 13 of 3U at a middle part, the power supply module group may include a plurality of power supply modules therein, a plurality of servers and a plurality of switches are placed within the second region 12 of 23U at an upper part, in which 3U of the second region 12 of 23U at the upper part are used to store the switches, and the remaining 20U are used to store the servers. In an embodiment of the present disclosure, the 3U switches may be positioned at a top part of the second region 12 (as shown in FIG. 2*a*) or at a bottom part of the second region 12 (as shown in FIG. 2*c*).

As shown in FIG. 2 (*b*) and FIG. 2 (*d*), for the 42U server cabinet 10, a plurality of servers may be placed within the first region 11 of 20U at a lower part, a power supply module group may be placed within the power supply region 13 of 3U at a middle part, the power supply module group may include a plurality of power supply modules therein, a plurality of servers and a plurality of switches are placed within the second region 12 of 19U at an upper part, in which 3U of the second region 12 of 19U at the upper part are used to store the switches, and the remaining 16U are used to store the servers. In an embodiment of the present disclosure, the 3U switches may be positioned at a top part of the second region 12 (as shown in FIG. 2*b*) or at a bottom part of the second region 12 (as shown in FIG. 2*d*).

It should be understood that, a specific position where the switch is positioned within the cabinet body 10 is not limited in the present disclosure, which may be adjusted according to needs.

Figure 3:
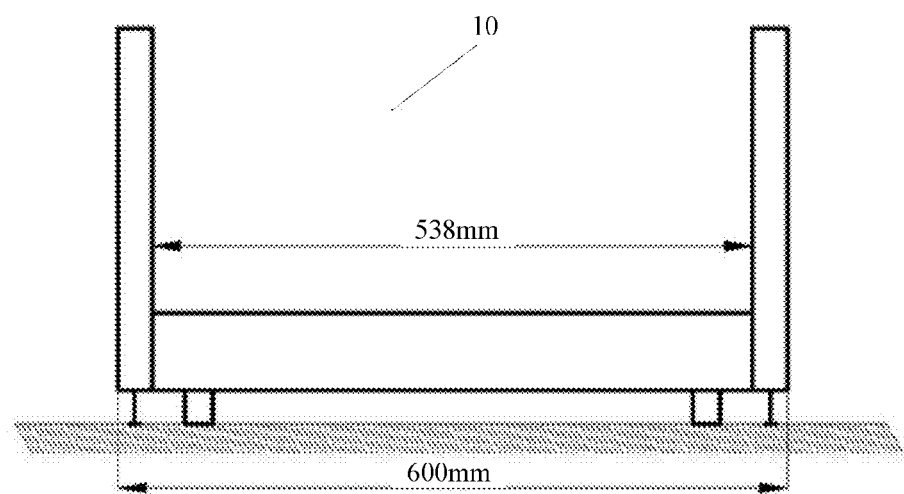
FIG. 3 is a schematic diagram illustrating a width of a first region and a second region according to an embodiment of the present disclosure.

In an embodiment of the present disclosure, both the first region 11 and the second region 12 are of a width of 538 mm. Specifically, as shown in FIG. 3, a traditional 19 inches server cabinet is of an inner width (i.e. a limiting of the server's allowable width) of 450 mm, 1U height of an inner apace within the cabinet body 10 can maximum support two servers to place, because a traditional half-width mainboard is of a width of 6.5 inches (165.1 mm), so only two half-width mainboards can be placed within a space with a width of 450 mm. The cabinet body 10 in the present disclosure and the traditional server cabinet are consistent in appearance, both has an outer width of 600 mm, the widths of the first region 11 and the second region 12 are expanded to 538 mm, so three half-width mainboards can be placed within such the apace, thus enabling 1U space to place three servers, achieving an extension to the storage space within the cabinet body 10, and improving a space density within the server cabinet. In addition, as the cabinet body 10 and the traditional server cabinet are consistent in appearance, a layout of the server cabinet in a computer room and a transportation mode of the server cabinet will not be affected.

Figure 4:
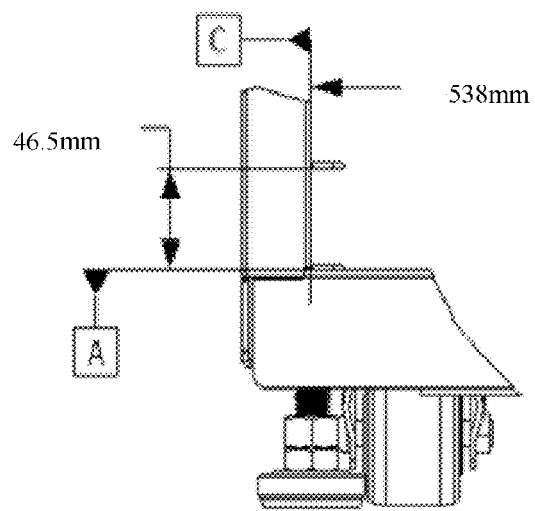
FIG. 4 is a schematic diagram illustrating a 1U height of a server cabinet according to an embodiment of the present disclosure.

In an embodiment of the present disclosure, each U within the cabinet body 10 is of a height of 46.5 mm. Specifically, as shown in FIG. 4, to solve a problem of server sinking in the cabinet body 10 caused by the width increasing of the first region 11 and the second region 12, in the present disclosure, the height of each U within the cabinet body 10 is increased from a standard of 44.45 mm to 46.5 mm. It should be understood that, U is a unit representing an outer dimension of the server, and is an abbreviation of unit, the server specifies a width of 482.6 mm (19 inches) and a height being multiple of 44.45 mm. In other words, 1U equals to 44.45 mm, 2U equal to 88.9 mm which is 2 multiples of 44.45 mm. In the present disclosure, the height of each U within the cabinet body 10 is increased by 2 mm, thus solving a problem that the switch cannot be mounted within the cabinet space of the traditional server cabinet.

It should be understood that, each U within the traditional server cabinet is of a height of 44.45 mm, in which in addition to a support frame thickness of about 2 mm, only a height space of about 42.45 mm is reserved for the switches, however a traditional switch normally is of a height of about 44 mm, therefore, the switches cannot be placed within the cabinet space of the traditional server cabinet.

As shown in FIG. 1, the cabinet backboard 20 is positioned at a back side of the cabinet body 10, and includes a plurality of management backboards 21 and a plurality of fans 22, each of the plurality of management backboards 21 is respectively connected with the server and a central management module of the server cabinet, that is, the server is connected with the corresponding management backboard 21 via a connector, thus enabling the central management module to control the server via the cabinet backboard 20.

Figure 5:
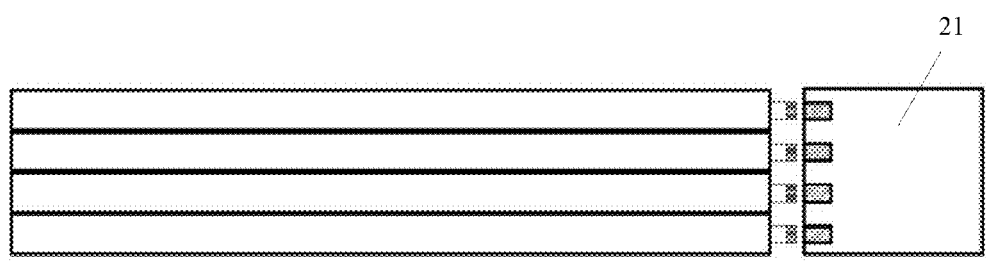
FIGS. 5 (a) and (b) are schematic diagrams illustrating a management backboard according to an embodiment of the present disclosure.
Figure 5:
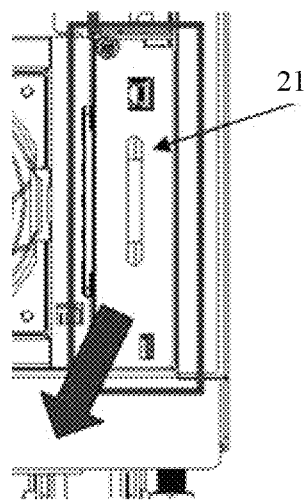

In an embodiment of the present disclosure, the connector is a PCIE connector or other known connectors. Specifically, as shown in FIG. 5 (*a*) and FIG. 5 (*b*), each management backboard 21 may correspond to four servers, each server may be connected with the management backboard 21 via the PCIE connector (in FIG. 5 (*a*), a left side represents the server, a right side represents the management backboard 21). In addition, the management backboard 21 may also be connected with the switch via the PCIE connector, and is used to manage the server and the switch. That is, in the present disclosure, by extra-positioning the management backboard 21, a hot plug of the management backboard 21 can be achieved at a rear end of the server cabinet, and a hot plug of a server node can be achieved at a front end of the server cabinet, without powering off the whole server cabinet or the server within the server cabinet.

Figure 6:
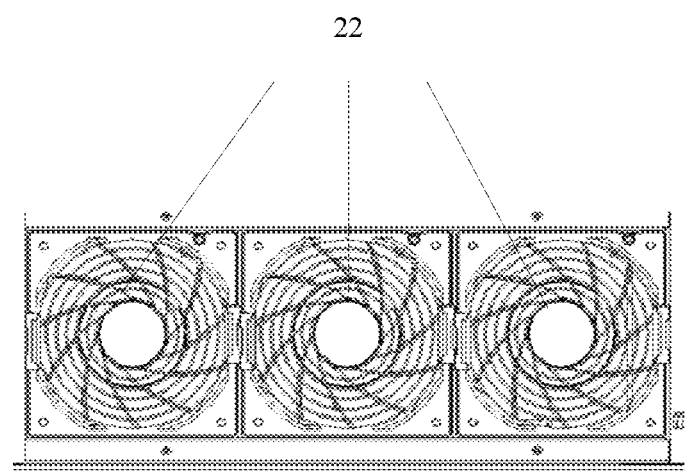
FIGS. 6 (a) and (b) are schematic diagrams illustrating a fan according to an embodiment of the present disclosure.
Figure 6:
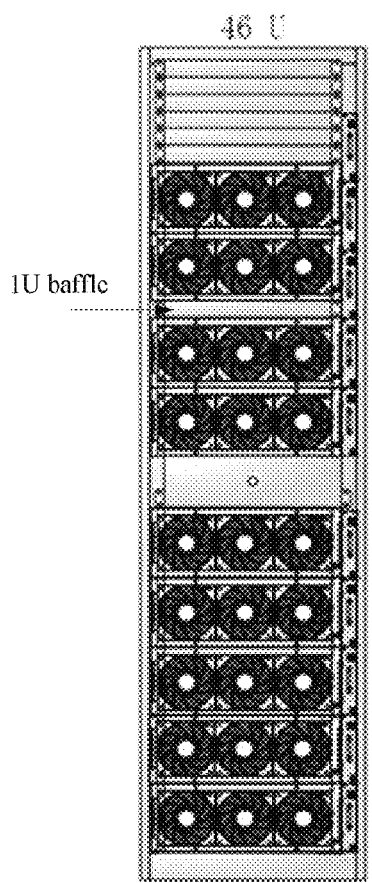

In an embodiment of the present disclosure, a position of the fan 22 in the cabinet body 10 is adjusted according to a position of the server. Specifically, as the position of the fan 22 cannot be adjusted flexibly within the traditional server cabinet, the expansion and flexibility of the server cabinet is greatly reduced. As shown in FIG. 6 (*a*), the present disclosure achieves a flexible adjustment of the fan 22 according to the position of the server at the front end within the server cabinet 10 by each U. For example, a fan window for supporting the fans 22 by a tooth-shaped structure may be disposed at the rear end of the cabinet body 10, thus achieving 1U adjustment upward or downward. The fan 22 may be drawn in direction of the arrow, thus enabling the fan 22 to achieve the position adjustment in up-down direction by 1U as the unit within the inner of the cabinet body 10. For example, as shown in FIG. 6 (b), the 46U cabinet body 10 has 37 servers therein which is not multiples of 4U, in this situation, the cabinet body 10 dose not need to configure 10 groups of fans therein, but 9 groups of fans can be adjusted and the 1U baffle is utilized to solve the problem of heat dissipation of 37 servers, thus optimizing the efficiency of the heat dissipation.

Figure 7:
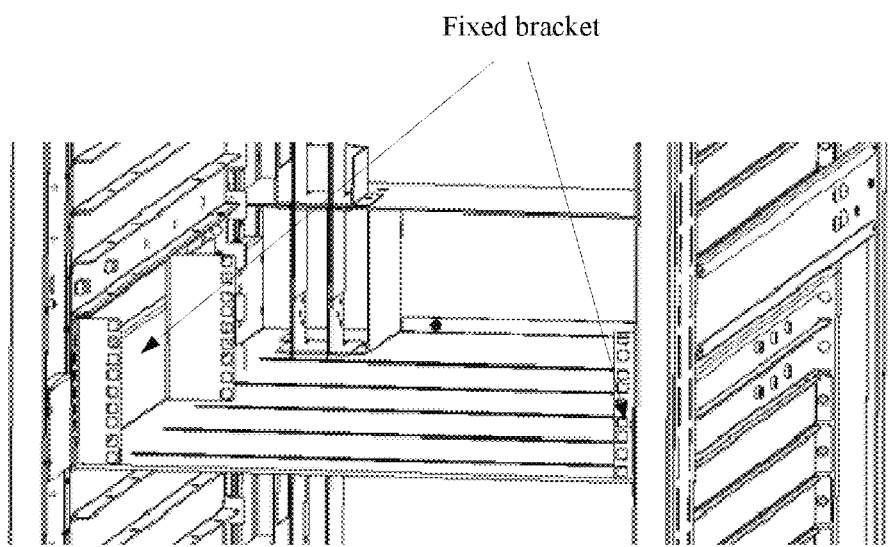
FIG. 7 is a schematic diagram illustrating a fixed bracket within a power supply region according to an embodiment of the present disclosure.

In an embodiment of the present disclosure, the power supply region 13 has a fixed bracket for supporting a plurality of power supplies therein. Specifically, the traditional server cabinet is of an inner width of 450 mm where 8 power supplies with a width of 19 inches may be mounted. However, the maximum width of the power supply region 13 in the present disclosure can be increased to 538 mm, that is, the width of the power supply region 13 may be the same with these of first region 11 and the second region 12. Therefore, as shown in FIG. 7, the power supply mounted within the traditional server cabinet with the inner width of 450 mm may be supported by adding the fixed bracket within the power supply region 13. In other words, the number of power supplies can be flexibly configured by the fixed bracket.

Further, the power supply region 13 will have a larger mounting space if taking the fixed bracket out of the power supply region 13, thereby achieving more power supplies, for example, ten power supplies in total, to be mounted within the power supply region 13, thus a maximum power supply of the server cabinet is upgraded to 12 kW.

Figure 8:
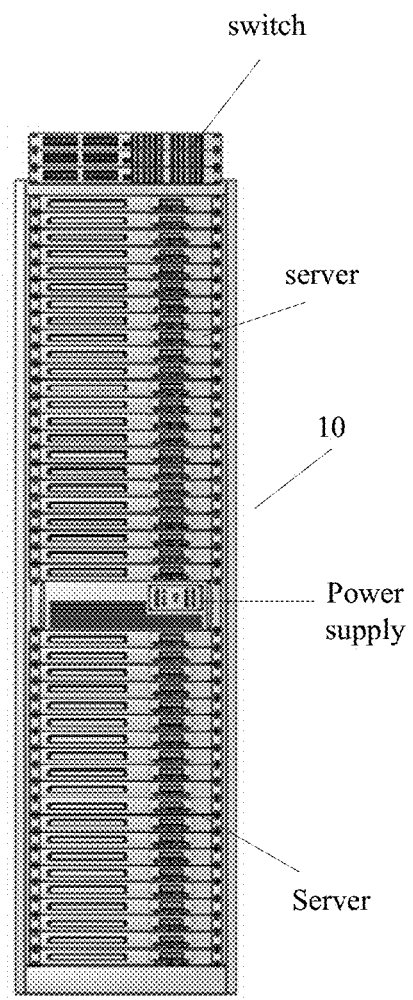
FIG. 8 is a schematic diagram illustrating a top part of a server cabinet according to an embodiment of the present disclosure.

In an embodiment of the present disclosure, the second region 12 has the fixed bracket for supporting a plurality of switches therein. Specifically, as the width of the second region 12 in the present disclosure is 538 mm, so the fixed bracket may also be mounted within the second region 12, so as to support the switch mounted within the traditional server cabinet with the inner width of 450 mm. In an embodiment of the present disclosure, as shown in FIG. 8, in the present disclosure, a corresponding fixed hole is reserved on the top part of the server cabinet, which enables the switch to be externally disposed on the top part of the server cabinet compatibly, thus providing a larger extension space of the switch and the server within the whole server cabinet.

The server cabinet according to the present disclosure has following advantages:

1. A server storage density and an overall storage density of the server cabinet are greatly improved without affecting a layout of a computer room and a transportation mode of the server cabinet;

2. By extra-positioning the management backboard, a replacement of the management backboard and the server can be achieved without powering off the server cabinet when breaking down, thus greatly improving the ability to operate and maintain of the server cabinet;

3. The fan can be adjusted in up-down direction by 1U as the unit, thus the servers with different number and positions can be matched to the fans with different number and positions, thereby optimizing the heat dissipation of the server cabinet, lowering the overall power consumption of the fan, and improving the flexibility and scalability of the overall layout of the server cabinet.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A server cabinet, comprising:
a cabinet body having a plurality of regions comprising a first region to store a server, a power supply region to store a power supply, and a second region to store the server and a switch; and
a cabinet backboard positioned at a back side of the cabinet body, and comprising a plurality of management backboards and a plurality of fans, wherein each of the plurality of management backboards is respectively connected with the server and a central management module of the server cabinet, the server is connected with the corresponding management backboard via a connector and controlled by the central management module via the cabinet backboard;
wherein the power supply region is positioned above the first region, and the second region is positioned above the power supply region.

2. The server cabinet according to claim 1, wherein a position of the fan in the cabinet body is adjusted according to a position of the server.

3. The server cabinet according to claim 2, further comprising a fan window for supporting corresponding fans by a tooth-shaped structure and disposed at a rear end of the cabinet body.

4. The server cabinet according to claim 3, wherein the position of the fan in the cabinet body is adjusted according the fan window upward or downward.

5. The server cabinet according to claim 1, wherein both the first region and the second region are of a width of 538 mm.

6. The server cabinet according to claim 1, wherein the power supply region has a fixed bracket for supporting a plurality of power supplies therein.

7. The server cabinet according to claim 1, wherein the second supply region has a fixed bracket for supporting a plurality of switches therein.

8. The server cabinet according to claim 1, wherein each U within the cabinet body is of a height of 46.5 mm.

9. The server cabinet according to claim 3, further comprising a baffle disposed between the corresponding fan windows.

10. A server cabinet, comprising:
- a cabinet body having a plurality of regions comprising a first region to store a server, a power supply region to store a power supply, and a second region to store the server and a switch; and
- a cabinet backboard positioned at a back side of the cabinet body, and comprising a plurality of management backboards and a plurality of fans, wherein each of the plurality of management backboards is respectively connected with the server and a central management module of the server cabinet, the server is connected with the corresponding management backboard via a connector and controlled by the central management module via the cabinet backboard;
- a fan window for supporting corresponding fans by a tooth-shaped structure and disposed at a rear end of the cabinet body;
- wherein a position of the fan in the cabinet body is adjusted according to a position of the server.

* * * * *